United States Patent
Iwasa et al.

(10) Patent No.: US 8,228,148 B2
(45) Date of Patent: Jul. 24, 2012

(54) ANNULAR MAGNET SYSTEM FOR MAGNETIC RESONANCE SPECTROSCOPY

(75) Inventors: Yukikazu Iwasa, Weston, MA (US); Masaru Tomita, Arlington, MA (US)

(73) Assignees: Massachusetts Institute Of Technology, Cambridge, MA (US); Railway Technical Research Institute, Tokyo (JP)

( * ) Notice: Subject to any disclaimer, the term of this patent is extended or adjusted under 35 U.S.C. 154(b) by 0 days.

(21) Appl. No.: 12/976,203

(22) Filed: Dec. 22, 2010

(65) Prior Publication Data

US 2011/0210729 A1    Sep. 1, 2011

Related U.S. Application Data

(62) Division of application No. 11/542,628, filed on Oct. 3, 2006, now Pat. No. 7,859,374.

(60) Provisional application No. 60/723,182, filed on Oct. 3, 2005.

(51) Int. Cl.
*H01F 7/00* (2006.01)
*H01F 1/00* (2006.01)
*H01F 6/00* (2006.01)
*H01F 3/00* (2006.01)
*H01F 5/00* (2006.01)
*G01R 33/02* (2006.01)

(52) U.S. Cl. ........ 335/216; 335/296; 335/297; 335/298; 335/299; 335/300; 324/200; 324/248

(58) Field of Classification Search .................. 335/216, 335/296–301; 324/200, 248, 71.6; 174/15.4, 174/125.1; 336/155; 361/139
See application file for complete search history.

(56) References Cited

U.S. PATENT DOCUMENTS

| | | | |
|---|---|---|---|
| 3,919,677 A | 11/1975 | Young et al. | |
| 4,766,378 A * | 8/1988 | Danby et al. | 324/307 |
| 4,931,735 A | 6/1990 | Overweg et al. | |
| 4,974,113 A | 11/1990 | Gabrielse et al. | |
| 5,008,624 A | 4/1991 | Yoshida | |
| 5,138,383 A | 8/1992 | Shiga et al. | |
| 5,276,398 A | 1/1994 | Withers et al. | |
| 5,289,150 A | 2/1994 | Rabinowitz | |
| 5,309,106 A * | 5/1994 | Miyajima et al. | 324/318 |
| 5,310,705 A | 5/1994 | Mitlitsky et al. | |
| 5,394,130 A | 2/1995 | Xu et al. | |

(Continued)

FOREIGN PATENT DOCUMENTS

GB    2 219 406    12/1989

(Continued)

OTHER PUBLICATIONS

Yukikazu Iwasa, "HTS and NMR/MRI magnets: unique features, opportunities, and challenges," Science Direct, Physica C 445-448 (2006) 1088-1094.

(Continued)

*Primary Examiner* — Mohamad Musleh
(74) *Attorney, Agent, or Firm* — Weingarten, Schurgin, Gagnebin & Lebovici LLP

(57) ABSTRACT

A persistent-mode magnet, assembled from superconducting annuli, provides a micro coil NMR, in which compactness and manufacturability are provided for a variety of applications. An annular magnet for micro NMR can include a YBCO-annulus Helmholtz coil, for example, that can energized by a magnet system and then transported for use at a second location with an operating system.

46 Claims, 10 Drawing Sheets

U.S. PATENT DOCUMENTS

| | | | |
|---|---|---|---|
| 5,485,088 A * | 1/1996 | Westphal et al. | 324/320 |
| 5,539,366 A * | 7/1996 | Dorri et al. | 335/297 |
| 5,633,588 A | 5/1997 | Hommei et al. | |
| 5,696,476 A * | 12/1997 | Havens et al. | 335/216 |
| 5,701,075 A * | 12/1997 | Xu et al. | 324/318 |
| 5,724,820 A | 3/1998 | Iwasa | |
| 5,764,121 A | 6/1998 | Wheatley et al. | |
| 5,801,609 A | 9/1998 | Laskaris et al. | |
| 5,906,964 A | 5/1999 | Chu et al. | |
| 5,968,877 A | 10/1999 | Budai et al. | |
| 5,972,847 A | 10/1999 | Feenstra et al. | |
| 6,020,803 A | 2/2000 | Wheatley et al. | |
| 6,034,324 A | 3/2000 | Dixon et al. | |
| 6,084,497 A | 7/2000 | Crozier et al. | |
| 6,154,599 A | 11/2000 | Rey | |
| 6,294,972 B1 * | 9/2001 | Jesmanowicz et al. | 335/301 |
| 6,335,670 B1 * | 1/2002 | Kinanen | 335/296 |
| 6,617,852 B1 | 9/2003 | Danby et al. | |
| 6,711,421 B2 | 3/2004 | Wang et al. | |
| 6,806,712 B2 | 10/2004 | Akgun | |
| 6,856,223 B1 * | 2/2005 | Takeshima et al. | 335/301 |
| 6,861,933 B1 * | 3/2005 | Yoshida et al. | 335/301 |
| 6,925,316 B2 | 8/2005 | Rey | |
| 6,958,608 B2 | 10/2005 | Takagi et al. | |
| 6,977,571 B1 * | 12/2005 | Hollis et al. | 335/216 |
| 7,015,779 B2 * | 3/2006 | Markiewicz et al. | 335/299 |
| 7,084,635 B2 | 8/2006 | Morita et al. | |
| 7,106,058 B2 | 9/2006 | Wilker et al. | |
| 2003/0210051 A1 * | 11/2003 | Aihara et al. | 324/318 |

FOREIGN PATENT DOCUMENTS

| | | |
|---|---|---|
| JP | 2001-116816 | 4/2001 |
| WO | WO 88/10501 | 12/1988 |

OTHER PUBLICATIONS

Iwasa et al., "A "persistent-mode" magnet comprised of YBCO annuli," IEEE Transactions on Applied Superconductivity, vol. 15, No. 2, Jun. 2005.

* cited by examiner

ANNULAR MAGNET SYSTEM FOR MAGNETIC RESONANCE SPECTROSCOPY

CROSS REFERENCE TO RELATED APPLICATIONS

This application claims benefit of U.S. application Ser. No. 11/542,628 filed Oct. 3, 2006 and U.S. Provisional Application No. 60/723,182, filed Oct. 3, 2005, the entire contents of which are incorporated herein by reference.

BACKGROUND OF THE INVENTION

Magnets for magnetic resonance systems and methods for employing such systems in spectroscopy and biomedical applications are in general use. In many such applications it is desirable to provide a system that can produce a magnetic field having the required intensity, distribution and stability for high-resolution analytical spectroscopic applications. Superconducting thin films or wires have been proposed for use in magnets for a variety of applications. However, the cost and field requirements of such systems continues to render achieving the goal of their widespread use in commercial applications still unfulfilled.

There is an ongoing need for improvements in magnet design to provide less expensive magnetic resonance systems having the field strength, spatial distribution and temporal stability needed for a variety of spectroscopic applications.

SUMMARY OF THE INVENTION

The present invention relates to the use of a bulk superconducting material to provide a magnet system for magnetic resonance spectroscopy. In a preferred embodiment, the bulk superconducting material can be in the form of a plurality of annuli that are stacked to provide an annular magnet, the stack being cooled to below the critical temperature of the annuli with a cooling system. The annular assembly surrounds a cavity or bore which can be at ambient or room temperature. The material or sample to be analyzed is placed within the cavity with an NMR probe to obtain magnetic resonance spectra for analysis.

Although there has recently been a great performance improvement in yttrium barium copper oxide (YBCO) bulk disks, for example, such materials have yet to find a useful magnet application. The disk's features, such as improved current densities, provides for a preferred embodiment including a persistent-mode magnet, in which compactness and simple manufacturability are used for high-resolution NMR microspectroscopy or microcoil NMR. In a preferred embodiment an NMR magnet assembled entirely with superconducting annuli is configured to be energized to form a magnetic field at one site, transported, and connected to a magnetic resonance operating system and used at another site. Other superconducting annuli, such as other rare-earth compounds with a current density sufficient for a given application can also be used. The system configuration including critical current densities, the mechanical strength of the superconducting disks, system cryogenics, mechanical integrity, magnet energization procedure, site-to-site transit procedure, stability and protection, temporal field stability, field analysis, and shielding are important elements.

The present invention provides a system operating at 200 MHz or more, preferably at 300 MHz or higher frequencies. The system provides a field of at least 4.70 T (200 MHz) and preferably 7.0 T (300 MHz) or higher. A preferred embodiment, for example, operates at 11.74 T (500 MHz) with an RT bore size between 25 and 60 mm, for example, 43 mm. In this embodiment, liquid neon can be used with an operational temperature of 27.1 K, which can be cooled to a solid 15 K for transport of the annular magnet that has been energized. In a preferred embodiment the annular magnet generates a homogeneous field with a uniformity of at least 0.1 ppm to 0.01 ppm for a 10 mm diameter spherical volume.

A preferred method of using the invention involves the measurement and spectral analysis of a material for use in pharmaceutical and food industries for discovery and development of drugs and foods, and by medical doctors as a in-office outpatient tool for affordable routine clinical diagnostic tests such as blood, other bodily fluid or tissue samples removed from a patient. A material, gas or fluid, can be measured by insertion into the bore of the system with an NMR probe.

DETAILED DESCRIPTION OF THE INVENTION

Figure 1:
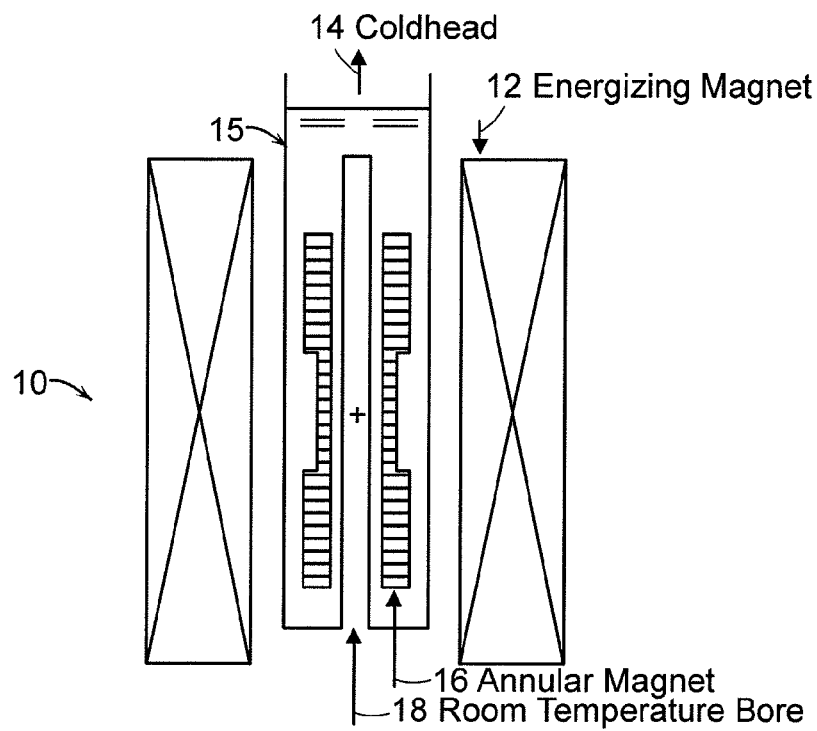
FIG. 1 is an energizing magnet from an annular superconducting magnet system in accordance with a preferred embodiment of the invention.

FIG. 1 shows a schematic of the system 10 configuration of an annular magnet 16, a cryostat 15 for the annular magnet, an external electromagnet 12 for energizing the magnet; and a coldhead 14. Note that the annular magnet has a room-temperature bore 18 and that the magnet is immersed in a bath of cryogen or surrounded by a volume of solid cryogen. Further details regarding the system can be found in Iwasa et al., "A Persistent Mode Magnet Comprised of YBCO Annuli" Proceedings ASC 2004, Jacksonville, Fla., Oct. 4, 2004, the entire contents of which is incorporated herein by reference. A bulk superconducting material can be a rigid section of material having a cross-sectional area of at least 1 cm², for example, with a thickness of at least 1 mm and a tensile strength as set forth herein. Other rare-earth superconducting compounds of the form Re—Ba—Cu—O such as DyBCO (dysprosium), NdBCO (neodymium), and HoBCO (holmium) which have the desired current density and field uniformity as described herein can also be used.

Critical current density ($J_c$) and tensile strength ($\sigma$) data are presented in Table I for a YBCO disk. For a field of 7 T, the material's $\sigma$ must be at least ~20 MPa.

TABLE 1

YBCO CURRENT DENSITY & STRENGTH DATA [1]

| Parameters | Value |
|---|---|
| Critical current density, $J_c$ A/m$^2$ | $10^9$ A/m$^2$ |
| 77.3 K; 1.08T | 0.3 |
| 29 K; 17T | 3 |
| Tensile strength, $\sigma$ 293 K [MPa] | 53 |

Most high temperature superconducting (HTS) magnets are operated "dry," i.e., not immersed in a bath of cryogen but coupled to a cryocooler. However, because the annular magnet in this system can be energized at one site, where a large energizing magnet is stationed, and transported to the user site, in which no such energizing magnet is available, the system, with a fully-energized magnet, must possess a sufficient heat capacity to keep the magnet, during a site-to-site transit, either at a constant temperature in a bath of cryogen or within an acceptable temperature range, e.g., 20-40 K, cooled by a volume of solid nitrogen, for example. The bulk semiconductor material has a current density of at least 10 MA/m$^2$ at 77.3 degrees Kelvin and preferably of at least 100 MA/m$^2$ at that temperature or below.

Table II presents four heat capacity sources, each with the corresponding magnet operating temperature, $T_{op}$, and a maximum center field, $B_o$, achievable. Note that each system, even that relies on a bath of cryogen, is cryocooled, with a coldhead placed at the top of the cryostat. The coldhead either recondenses the cryogen vapor or maintains the temperature of solid nitrogen at 20 K. In the solid nitrogen system, however, $T_{op}$ is permitted to rise up to 40 K during transit and over this temperature excursion the magnet is designed to keep its nominal operating field of $B_o$ constant within the system's temporal field stability requirement.

TABLE II

HEAT CAPACITY SOURCE; $T_{op}$, MAXIMUM $B_o$

| Heat Capacity Source | $T_{op}$ [K] | Maximum $B_o$ [T] |
|---|---|---|
| 1. Liquid Helium | 4.2 | >15 |
| 2. Liquid Neon | 27.1 | Up to ~15 |
| 3. Liquid Nitrogen | 77.3 | Up to ~3 |
| 4. Solid Nitrogen | 20→40* | Up to ~1 |

*Nominal $T_{op}$: 20 K; may rise up to 40 K during transit.

Unlike a conductor-based magnet, in which a reinforcement element may be placed directly in the conductor, co-wound with the conductor, or placed outside the winding, each annulus in this magnet must withstand magnetic stresses. For a field of 10 T, stresses may reach 40 MPa. The YBCO disks for the preferred embodiments of the invention have "trapped" a field of 17 T, or withstood stresses up to ~120 MPa. For compact microcoil NMR magnets for applications such as drug discovery and development in the pharmaceutical industry, a field of 7.05 T or higher (300 MHz) is deemed adequate; the corresponding stress of 20 MPa are low enough for these annuli. Thus for many applications it is desirable to have a magnetic field generating by the annular magnet at the operating temperature of at least 5 T.

The disks are made using a melt textured growth (MTG) process in which sintered YBCO pellets with the required stoichiometry are partially melted and cooled. The current density at 77 degrees Kelvin or lower is preferably at least 100 MA/m$^2$. The material can also be made using liquid phase processing (LPP), quenched and melt growth (QMG) and melt powder melt growth (MPMG) processing. In general, bulk material can be manufacturing using a single crystal growth process from a seed. The resulting product can have a length and width ranging from 20 mm to 100 mm, for example, which is sliced into disks having a thickness of more than 1 mm, typically about 10 mm. Alternatively, in another preferred embodiment, disks can be made using thin annuli of less than 1 mm in thickness that are cut from a thin film or tape of sufficient width and length. Many layers of these thin films are cut into annuli and stacked to provide a single magnet annulus. This can be a laminated structure having in excess of 1000 think film annuli that are each on the order of one micron in thickness.

Figure 2A:
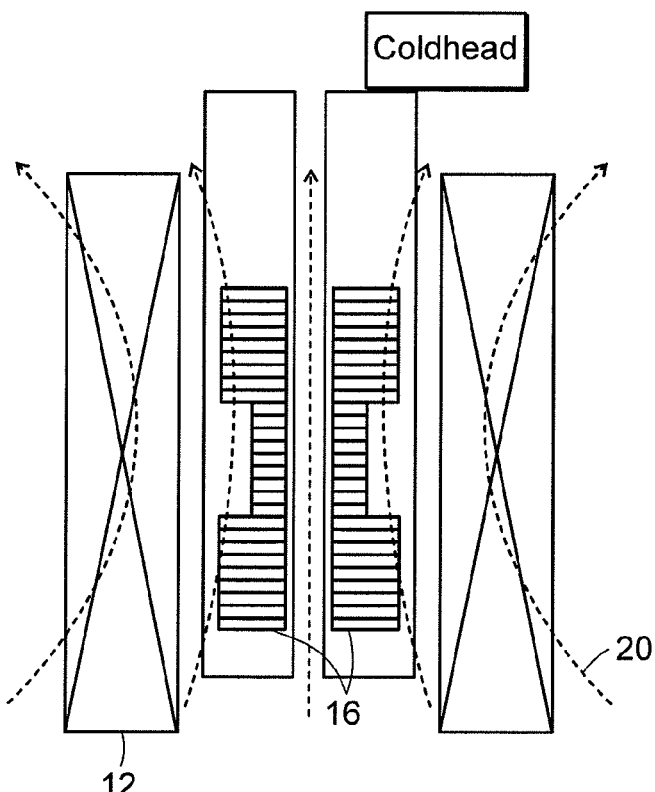
FIGS. 2A-2C illustrate an energization procedure in accordance with a preferred embodiment of the invention.
Figure 2B:
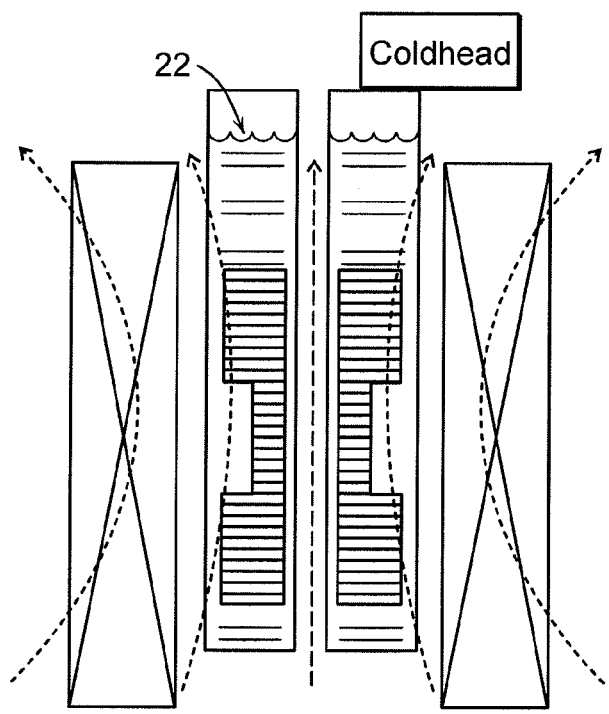
Figure 2C:
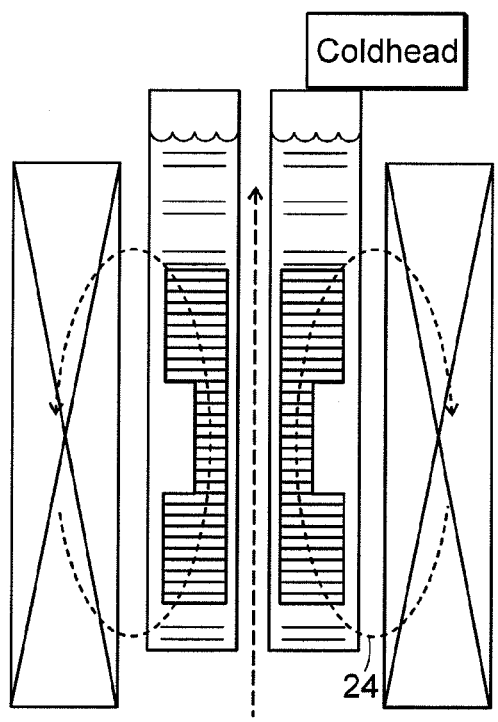

The procedure for energizing an annular magnet, housed in a cryostat and placed in the bore of an external electromagnet, basically consists of the following steps which are illustrated in FIGS. 2A-2C.

With the YBCO annuli at a temperature above its critical temperature, 93 K, energize the external electromagnet 12 to a level sufficient to enable the annular magnet 16 to trap a field that results in the design center field 20 (FIG. 2A). If shielding steel sheets are to be introduced afterwards for site-to-site transit of an energized magnet, and that can be kept at the user site, the energizing field is preferably adjusted to include the contribution of the steel sheets to the final center field.

While the external magnet is at a constant field, cool the annular magnet to its $T_{op}$ by: immersing it in a bath 22 of liquid helium ($T_{op}$=4.2 K), liquid neon (27.1 K), or liquid nitrogen (77.3 K); or solidifying liquid nitrogen, already in the cryostat with the cold head, and cooling it further to 40 K, a maximum $T_{op}$ permitted in the system in which the solid nitrogen is the source of heat capacity during the site-to-site transit (FIG. 2B).

Figures 3A, 3B:
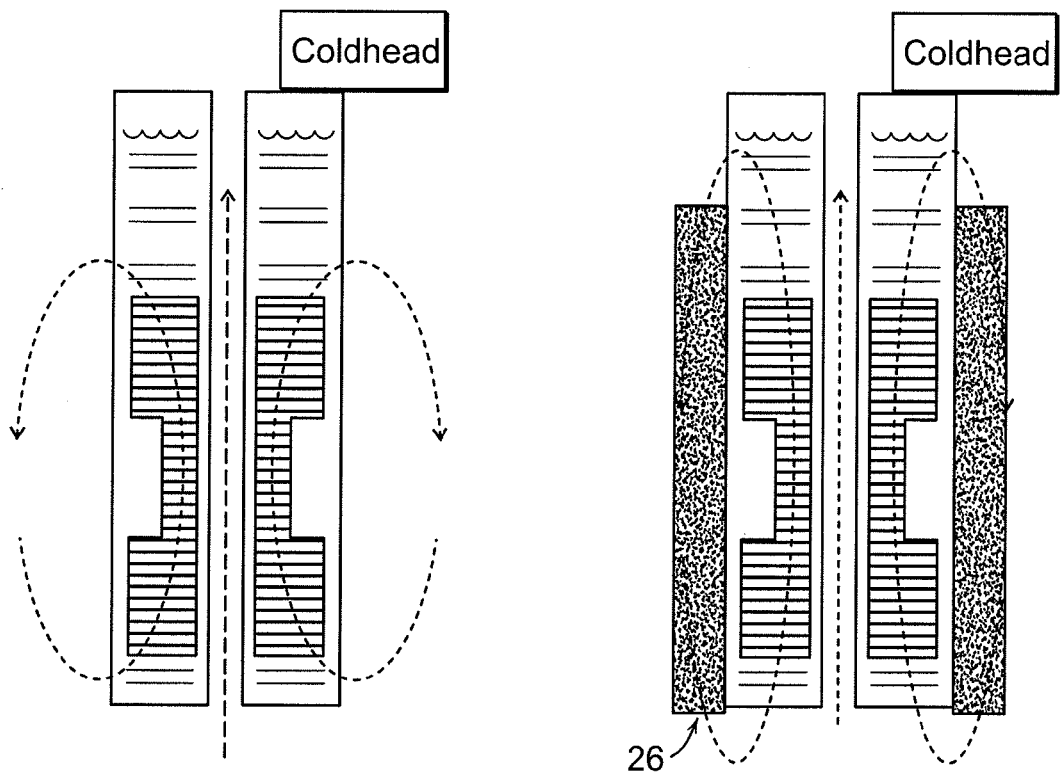
FIGS. 3A-3B illustrate steps of a magnet transport procedure in accordance with the invention.

Reduce the external field to zero, "field-cooling" each annulus, thereby causing the annular magnet to trap a field 24 (FIG. 2C), which when the magnet is shielded, results in the desired field intensity level with a required spatial distribution. In the solid nitrogen system, further cool the cold body (annular magnet/solid nitrogen) to 20 K, a nominal operating temperature of this system with the cryocooler on. The external magnet is then removed (FIG. 3A) from the annular magnet system for shielding 26 (FIG. 3B) and then packaging.

Though the energizing magnet itself generates a field that is only axially symmetric, satisfying no specific homogeneity requirements, the annular magnet can be configured to create a field with an "NMR-quality" spatial homogeneity.

In the cryogen-cooled system, the volume of cryogen in the cryostat must be sufficient to keep the annular magnet at $T_{op}$ until the time of cryogen refilling at the user site. In the solid nitrogen system, the volume of solid nitrogen must be sufficiently large to keep $T_{op}$ below 40 K. Magnetic field shielding, required for transportation and at the user site, is discussed below.

With HTS magnets, this YBCO annular magnet is stable irrespective of its $T_{op}$, which may range from 4 K to 77 K. For more details regarding YBCO disks for a magnet see Iwasa et al., "Thermal and Magnetic Responses of a Solid Nitrogen/Magnetized YBCO Disk System Undergoing Temperature Cycles in the Range of 8-60 K", IEEE Trans. Appl. Superconduc. 14 1727(2004) and Tomita et al., "High Temperature Superconductor Bulk Magnets that can Trap Magnetic Fields over 17 Tesla at 29 K", Nature 421, 517 (2003), the entire contents of these publications being incorporated herein by reference.

An important feature of an annular magnet in terms of protection is that the induced supercurrents in the annuli are not series-connected, rather they, though coupled, can operate essentially independent of one another. Thus, a likelihood of one quenching annulus absorbing the entire stored magnetic energy of the magnet is virtually nill. Quenching may spread out slowly from one annulus to the adjacent annuli, each annulus in the process absorbing as heat at worst slightly more than its own stored energy. Winding materials escape permanent damage if the stored magnetic energy is absorbed as heat by as little as ~10% of the entire winding.

The induced supercurrent, amplitude and spatial distribution, remains constant as long as each annulus temperature is at or below the field-cooling temperature, $T_{fc}$. To ensure that the condition $T_{op} < T_{fc}$ is maintained, the liquid pressure can be increased when field-cooling: 1.3 atm for helium ($T_{fc}$=4.5 K); 1.32 atm for neon ($T_{fc}$=28 K); 1.34 atm for nitrogen ($T_{fc}$=80 K). Note that for the solid nitrogen cooled system, $T_{fc} \leq 43$ K, slightly above the maximum $T_{op}$=40 allowed during a site-to-site transit.

A field analysis focuses on spatial field homogeneity and a superposition technique. An analytical tool to design a magnet to satisfy spatial field homogeneity is widely available. Along the magnet axis (z), which, in solenoidal magnets, is the direction with the largest change in field, $h_z \equiv H_z(\varsigma, r=0)/(\lambda J a_1)$, where $\varsigma \equiv z/a_1$, for a solenoid of winding i.d. $2a_1$, o.d. $2a_2$, and height $2b$ and having a constant overall current density; $\lambda J$, may be given, with $a \equiv a_2/a_1$ and $\beta \equiv b/a_1$, $$h_z(\varsigma) = F(a,\beta)[1 + E_2(a,\beta)\varsigma^2 + \ldots + E_{2j}(a,\beta)\varsigma^{2j}] \quad (1)$$

For a solenoid its center field, $H_z(0, 0)$, may be given, with $$F(\alpha,\beta) = \ln[(\alpha+\sqrt{\alpha^2+\beta^2})/(1+\sqrt{1+\beta^2})], \text{ by } H_z(0,0) = \lambda J a_1 F(\alpha,\beta) \quad (2)$$

Coefficients, $E_2(a,\beta), \ldots, E_{2j}(a,\beta)$, are known, e.g., $$E_2(\alpha, \beta) = \frac{1}{2\beta F(\alpha, \beta)} \left[ \frac{1}{(1+\beta^2)^{1.5}} - \frac{\alpha^3}{(\alpha^2+\beta^2)^{1.5}} \right] \quad (3)$$

A superposition technique may be applied to perform a field analysis on the $n^{th}$ pair of annuli symmetric about z=0. To account for a spatial variation of supercurrent density, $J_s(z, r, B)$, within each of the $n^{th}$ annulus pair, it is possible to segment each into m sub-annuli, within which $J_s(z,r,B)$ is uniform, i.e., $J_s^m$. A pair of $k^{th}$ sub-annuli may in turn be represented as a sum of two uniform-current density sub-solenoids k and k' of opposite current directions. Note that the size of each uniform-$J_s^m$ sub-annulus depends on the extent of spatial variation of $J_s(z, r, B)$ within each annulus, which in turn must be computed by numerical analysis.

Two dimensionless fields, $h_z(\varsigma)|_k^n \equiv H_z(\varsigma)|_k^n/(\lambda J_s^m a_1)_k^n$ and $h'_z(\varsigma)|_{k'}^n \equiv H'_z(\varsigma)|_{k'}^n/(\lambda J_s^m a_a)_{k'}^n$, of sub-solenoids $k_n$ and $k_n'$ in the nth annulus pair, respectively, are given by:

$$h_z(\varsigma)|_k^n = F(a_k^n, \beta_k^n)\left[1 + \sum_{j=1}^{\infty} E_{2j}(a_k^n, \beta_k^n)\varsigma^{2j}\right] \quad (4a)$$

$$h'_z(\varsigma)|_{k'}^n = F(a_k^n, \beta_{k'}^n)\left[1 + \sum_{j=1}^{\infty} E_{2j}(a_k^n, \beta_{k'}^n)\varsigma^{2j}\right] \quad (4b)$$

where $a_k^n = (a_2/a_1)$; $\beta_k^n = (b/a_1)$; $\beta_{k'}^n = (b'/a_1)$. $H_z(0,0)|_k^n$ and $H'_z(0,0)|_k^n$ for respective sub-solenoids are given by:

$$H_z(0,0)|_k^n = (\lambda J_s^m a_1)_k^n F(a_k^n, \beta_k^n) \quad (5a)$$

$$H'_z(0,0)|_k^n = (\lambda J_s^m a_1)_k^n F'(a_k^n, \beta_k^n) \quad (5b)$$

The combined dimensionless z-axis field of pair of $k^{th}$ sub-annuli in a pair of $n^{th}$ annuli, $[h_z(\varsigma)]|_k^n$, is given by:

$$[h_z(\varsigma)]|_k^n = h_z(\varsigma)|_k^n - h'_z(\varsigma)|_k^n \quad (6)$$

From (4) and (6) we have an expression for $[h_{zk}(\varsigma)]_k^n$:

$$[h_{zk}(\varsigma)]|_k^n = [F(a_k^n, \beta_k^n) - F'(a_k^n, \beta_{k'}^n)] + \sum_{j=1}^{\infty} [F(a_k^n, \beta_k^n)E_{2j}(a_k^n, \beta_k^n) - F'(a_k^n, \beta_{k'}^n)E'_{2j}(a_k^n, \beta_{k'}^n)]\varsigma^{2j} \quad (7)$$

The z-axis field of a magnet comprising $n^{th}$-annulus pairs can be computed by using equation (7) and summing up each field contribution: first uniform-$J_s$ m sub-annulus pairs within the $n^{th}$-annulus pairs, then n annulus pairs. Adjustable design parameters to meet a set of spatial field homogeneity requirements include inner diameter (i.d.), outer diameter (o.d.), and thickness of each annulus (in pair); spacing between adjacent annuli; and number of annuli in the magnet. As discussed below, each annulus-pair must be substantially identical not only in size but also, more importantly, $J_s(z, r, B)$, a set of demanding requirements but not unlike that of strict manufacturing specifications of high-resolution NMR magnets.

The fringing field of an energized annular magnet outside the package housing it for shipment is preferably "small". For a viable compact system, its fringing field must be $\leq 5$ gauss for the user at ~1 m from the magnet center.

In this embodiment, because of a coldhead at the top end of the cryostat, shielding steel sheets cannot be placed at the top or bottom end of the system—the system requires a symmetrical placement of magnetic materials. Thus steel annular sheets may be placed outside the cryostat either: before energization (option 1); or after energization but before shipment (option 2) to the user site. Option 1 requires an external magnet with a large room-temperature bore; because the system is already energized. Option 2 requires a careful placement procedures of the steel sheets.

In a first embodiment, the following describes a field analysis and measurements on a two-annulus Helmholtz coil. Each annulus, 25-mm i.d.; 48-mm o.d.; and 5-mm thick, was prepared from a 48-mm o.d. YBCO rod. Although, as stated above, each annulus pair is preferably identical, the two annuli used in this measurement had $J_s(z,r,B)$ distributions that differed slightly from each other. Such field disparities can be corrected using a magnetic field tuning device and method described herein.

In an example of the system is shown in FIG. 1, a two-annulus Helmholtz coil, with an adjustable gap distance, is used in place of an annular magnet. Here, an energizing magnet, 140-mm id., 320-mm o.d., 188-mm height, is wound with copper conductor and operated in a bath of liquid nitrogen. The Helmholtz coil's $H_z(z)$ is measured by a motor-driven search coil, at the central room-temperature bore and moved in the z-direction at a constant speed.

First, immerse the copper magnet in liquid nitrogen and, while the YBCO-annuli are still dry and above 93 K, energize the copper magnet to a constant field. Next, immerse the Helmholtz coil in liquid nitrogen, turning the YBCO annuli superconducting. Then, discharge the copper magnet, field-cooling the YBCO annuli. Then, move the search coil along the z-axis with a constant speed and integrate, digitally, the search coil output signal to generate an $H_z(z)$ plot, which is recorded.

In these measurements, comparison between experiment and analysis was limited to $H_z(z)$. Thus, the analysis did not invoke equation (7); rather each annulus was segmented into sub-annuli to account for a spatial variation in the induced supercurrent distribution, $J_s(x,r,B)$, and the field contribution from each sub-annulus was summed up along the z-axis to compute $H_z(z)$.

Figure 4:
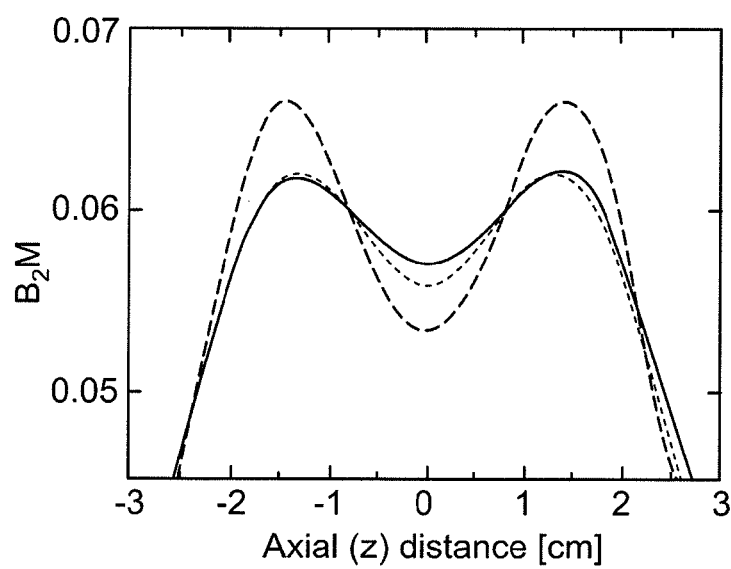
FIG. 4 is a graphical illustration of $H_z$ plots in a preferred embodiment.

FIG. 4 shows a set of three $H_z(z)$ plots, measured (solid), computed (dashed), and "weighted" (chain dotted), field-cooled at 0.08 T and 77.3 K. Here the measured plot corresponds to $H_z(z)$ averaged over the search coil active volume; the computed plot represents $H_z(z)$ for each axial point; and the weighted represents $H_z(z)$ averaged over the search coil active volume, axial as well as radial.

Although agreement between measured and weighted plots is excellent, the measured $H_z(z)$ is not completely symmetric about $z=0$. This field asymmetry is caused by a difference, however small, of $J_s(z,r,B)$ distributions of the two annuli. Thus, to synthesize an NMR-quality magnetic field with an annular magnet, induced by an external magnetic field of a nominal axial symmetry, each annulus-pair, though not all annuli, preferably have identical $J_s(z,r,B)$ (i.e., less than 1% variation in current density). For this Helmholtz coil this field asymmetry, as may be expected, became more pronounced as the energizing field was increased and the $J_s(z,r,B)$ difference became greater.

These measurements indicate that for magnets where compactness and simple manufacturability are vital, such as for microcoil NMR, this type of "persistent-mode" magnet, assembled entirely from YBCO annuli is suitable for this application. This analysis has shown that to synthesize a field with an NMR-grade spatial homogeneity, each annulus pair is preferably substantially identical not only in size but more crucially $J_s(z,r,B)$.

Figure 5:
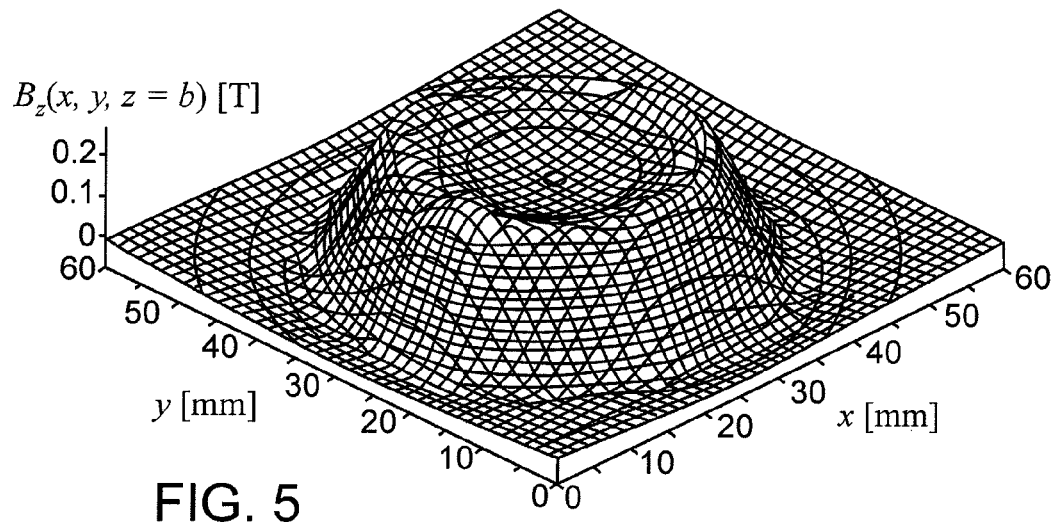
FIG. 5 is a B field profile of an annular magnet made in accordance with a preferred embodiment of the invention.
Figure 6A:
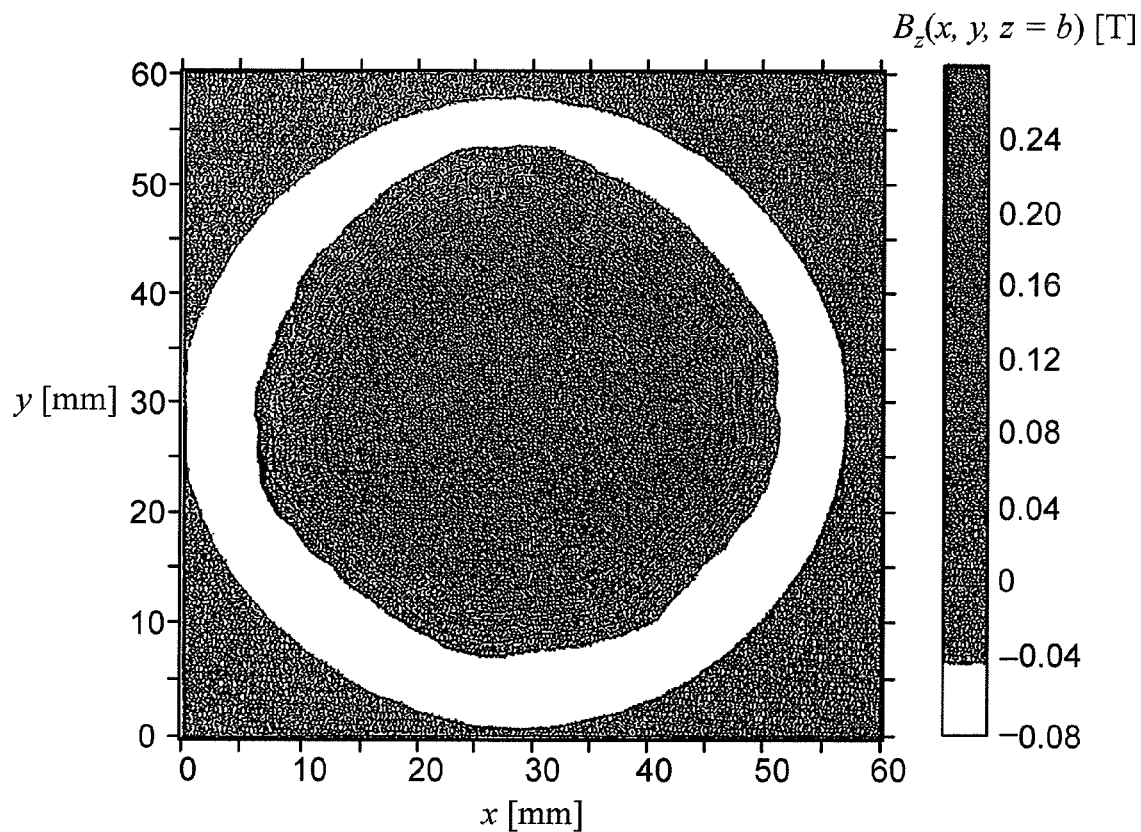
FIG. 6A is a graphical representation of a constant field contour.
Figure 6B:
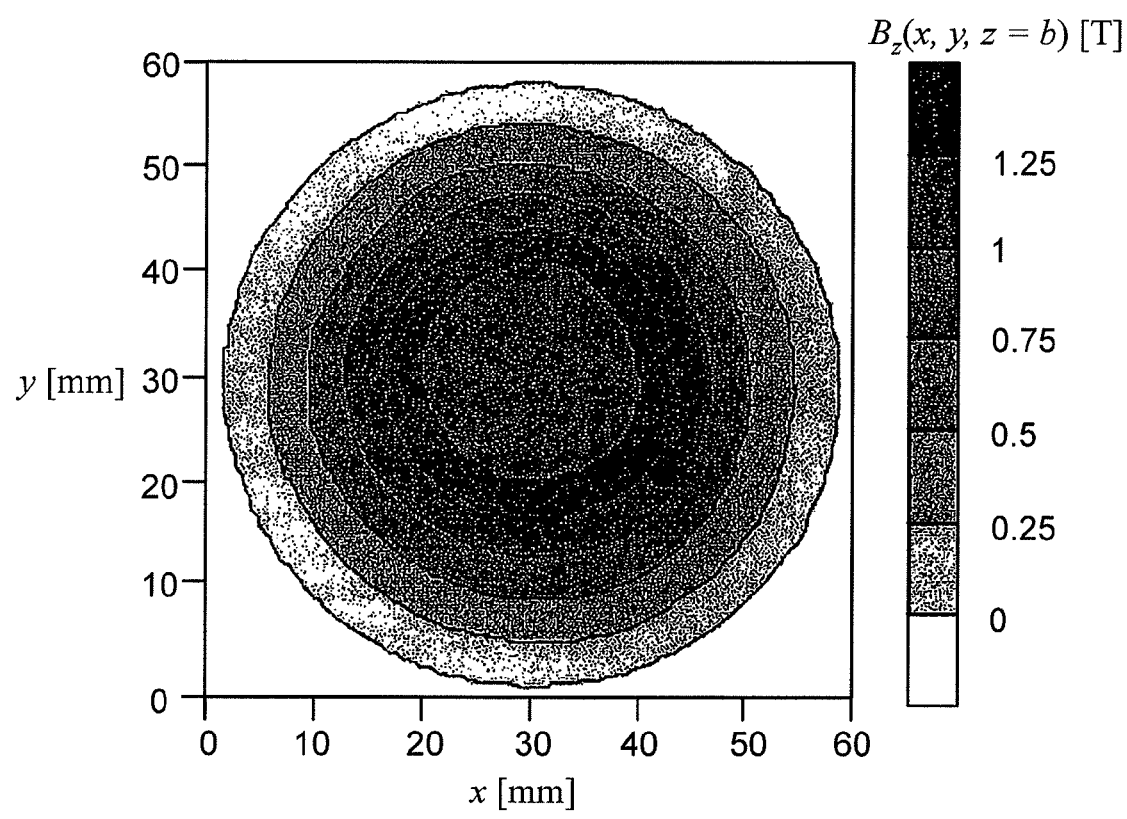
FIG. 6B is a graphical representation of a field contour of an annular disk in accordance with the invention.

FIG. 5. Shows a contour plot of B of a field cooled system at 77.3 K, for example. FIG. 6A shows constant field contours resulting from the data of FIG. 5. The contours in FIG. 6A indicate that the supercurrent distribution at each radial location in this annulus is not angle independent, which is preferably true in 300 MHz to 600 MHz systems. FIG. 6B illustrates the field contours of an annular disk in accordance with the invention having further improvements in field intensity and uniformity.

In an example, consider that the average critical current density $\tilde{J}_c(77.3\ K)$ is related to the annulus center flux density, $B_z(0,0,0)$, which is derivable from $B_z(0,0,b)$. Thus:

$$B_z(0, 0, 0) = \mu_o \tilde{J}_c(77.3\ K) a_1 \beta \ln\left[\frac{\alpha + \sqrt{\alpha^2 + \beta^2}}{1 + \sqrt{1 + \beta^2}}\right] \quad (8)$$

For a uniform current density solenoid (or annulus), $B_z(0,0,b)$ and $B_z(0,0,0)$ are related:

$$B_z(0,0,b) = \tfrac{1}{2} B_z(0,0,0;\beta') \quad (9)$$

where $B_z(0,0,0;\beta')$ is the center field of a solenoid (or annulus) of the same $\tilde{J}_c(77.3\ K)$ except with $\beta'=2\beta$. Equation 9 may be derived from simple superposition.

Combining Eqs. 8 and 9, and substituting $2\beta$ for $\beta$ in Eq. 8, we obtain:

$$B_z(0, 0, b) = \tfrac{1}{2}\mu_o \tilde{J}_c(77.3\ K) a_1 (2\beta) \ln\left[\frac{\alpha + \sqrt{\alpha^2 + (2\beta)^2}}{1 + \sqrt{1 + (2\beta)^2}}\right] \quad (10)$$

Solving Eq. 10, for $\tilde{J}_c(77.3\ K)$, with $\alpha=1.84$, $\beta=0.2$, and $a_1=0.0125$ m, the critical current density is:

$$\tilde{J}_c(77.3\ K) = \frac{B_z(0, 0, b)}{(4\pi \times 10^{-7}\ H/m)(0.0125 m)(0.2)} \times$$

$$\frac{1}{\ln\left[\frac{1.84 + \sqrt{(1.84)^2 + 4(0.2)^2}}{1 + \sqrt{1 + 4(0.2)^2}}\right]}$$

$$= 545.4 B_z(0, 0, b)\ MA/m^2$$

Figure 7A:
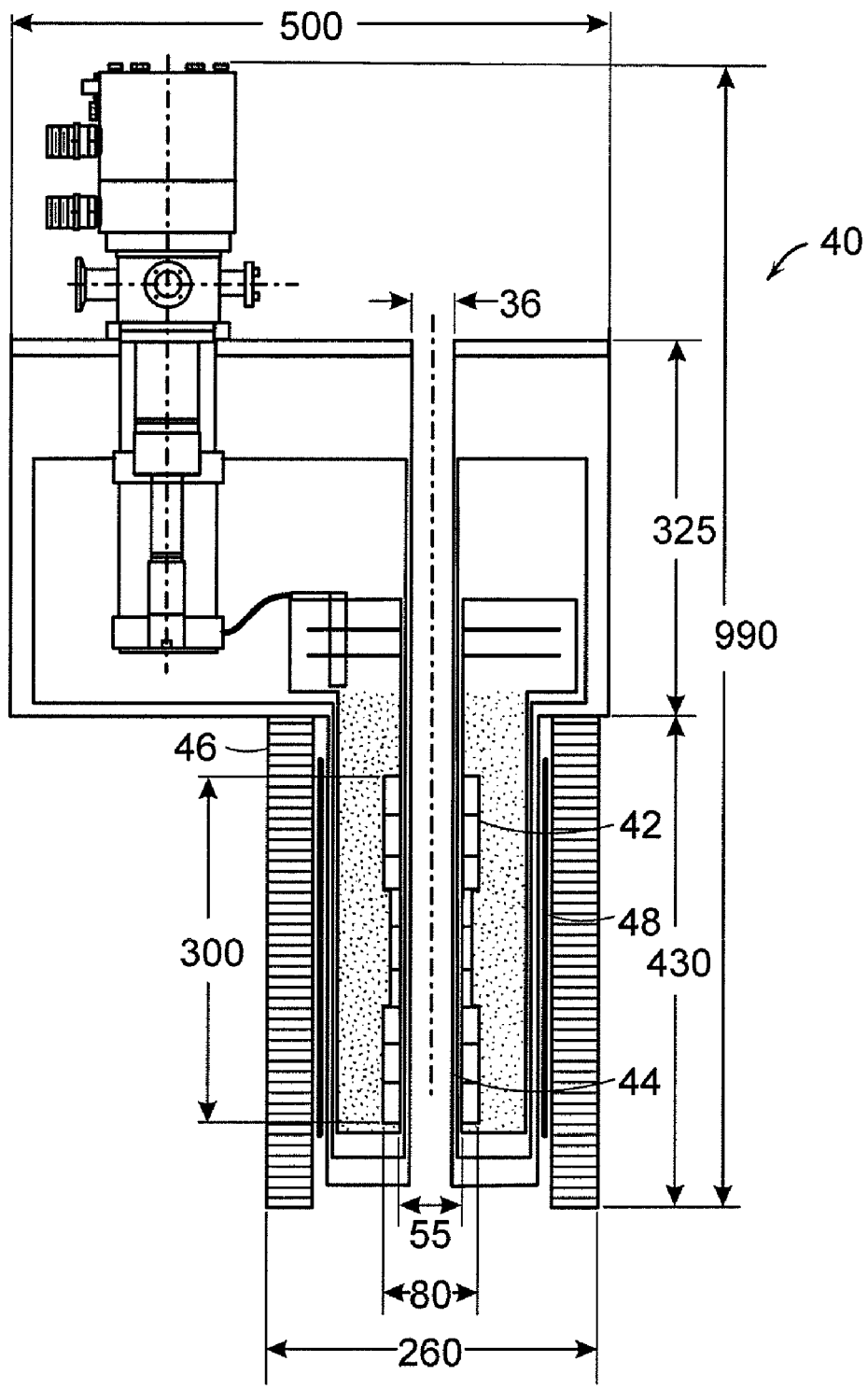
FIG. 7A is a preferred embodiment of an operating system for the annular magnet system of the invention.

A system 40 for operation at 500 MHz is shown in FIG. 7A. In this embodiment there are 24-28 annuli 42, for example, which are each separated by a spacer 44 such as a high strength thermally conductive metal such as a copper-silver alloy. The system has steel annuli sheets 46 placed outside the cryostat for field shielding. The shield can be thermally anchored to the first stage of the coldhead. The system uses metal coils 48 such as room temperature copper winding to adjust the field prior to use. A more detailed illustration of a system 60 in accordance with a preferred embodiment of the invention is shown in FIG. 7B.

Figure 7B:
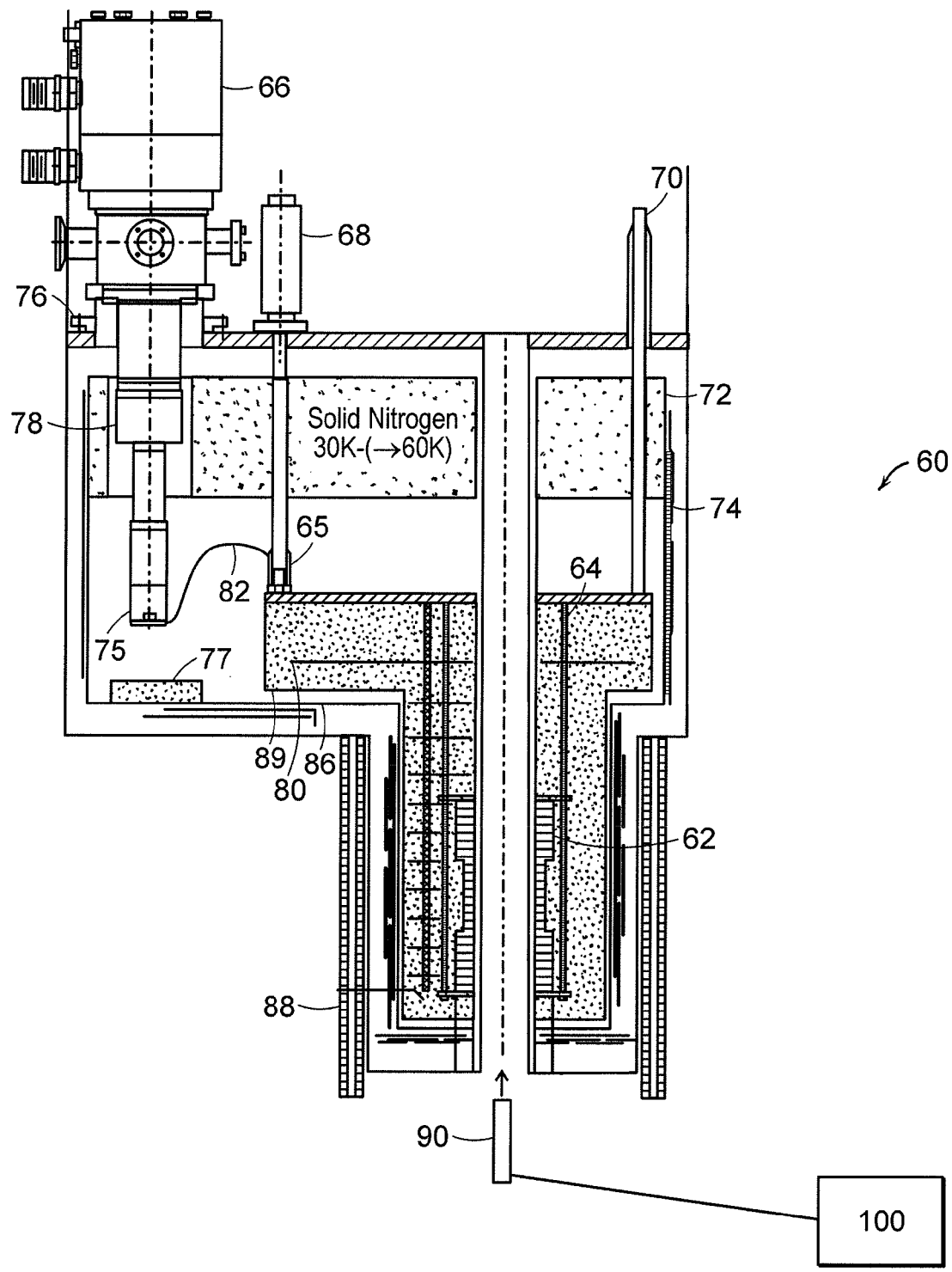
FIG. 7B illustrates a detailed sectional diagram of a magnetic resonance system in accordance with the invention.

FIG. 7B shows a schematic drawing of the cross-sectional view of the preferred embodiment of the present invention at the user site. This desk-top NMR magnet system 60 can consist of 16 annuli 62, each 55-mm i.d. and 10-mm thick. A number of annulus pairs, at the upper and lower sections, have an o.d. of 80 mm, while the remaining pairs of annuli in the center section have o.d.'s less than 80 mm, creating a "notch" effect. As schematically indicated in FIG. 7B, the entire magnet assembly is clamped axially with a support assembly 64 such as tie rods placed outside the annuli. The system can include thermal fins 80 and radiation shield 86.

Where the system has a uniform current density, $2a_1=55$ mm, $2a_2=80$ mm, and $2b\cong 187$ mm (here the spacers are included), i.e., $\alpha \cong 1.455$ and $\beta \cong 3.364$, computing J requires the annuli for the system to generate a central field, $B_z(0,0,0)$, of 4.7 T: $\lambda\ J \cong 320\ MA/m^2$. Because in an NMR-field-quality annulus magnet, $B_z(0,0,0)=4.7$ T is nearly equal to the "peak" field, 320 $MA/m^2$ is the average critical current density required in each annulus of the prototype, field-cooled at 27.1 K and operated nominally at 15 K. Note that with 320 $MA/m^2$ is ~1/10 of $\tilde{J}_c \cong 3000\ MA/m^2$ at 29 K, can be achieved with the YBCO disks.

A spacer is placed between adjacent annuli to satisfy three requirements: 1) field homogeneity; 2) mechanical reinforcement; and 3) thermal stability. A high-strength, conductive sheet of Cu/Ag alloy can be used for the spacer material.

At 4.7 T the maximum Lorentz-force induced tensile stress in each annulus, 80-mm o.d., 55-mm i.d., and 10-mm thick, is 45 MPa, well within the capacity of YBCO disks. High-strength (ultimate strength above 500 MPa and preferably close to 1,000 MPa; Young's modulus ~150 GPa) spacers takes some radial load off the annuli. The magnet assembly can be precompressed with tie rods to supplement the axial magnetic clamping in the magnet, which enhances the friction between the annuli and the spacers, helping in turn to ensure that the spacers share the load.

During the field-cool process when the energizing electromagnet is discharged, AC losses, primarily hysteretic, are generated in the annuli. Fortunately, the field discharge rate can be as slow as required to limit the dissipation-induced temperature rise, despite the low thermal conductivity of YBCO, in the annuli. The hysteretic energy density $e_{hy}$ [J/m³], may be given by:

$$e_{hy} = \frac{1}{V_o} \int_V \left[ \int_0^{\tau_d} \vec{E} \cdot \vec{J} dt \right] dV \quad (11)$$

where $\vec{E}$ is the electric field induced by the time-varying magnetic flux; $\vec{J}$, here $|\vec{J}|=J_c$, is the current density in the annulus; $V_o[=2\pi(a_2^2-a_1^2)b]$ is the annulus volume; and $\tau_d$, is the discharge time. Assume that $J_c$, (B) is constant at 1000 MA/m². (Note that an average current density of only 320 MA/m² over the entire cross section of each annulus is required to produce 4.7 T; use of 1000 MA/m² is appropriate for current confined only to ~⅓ of the annulus volume.) With $(a_2-a_1)=12.5\times10^{-3}$ m and $B_{fc}=5$ T, obtain: $e_{hy}$ 40×10⁶ J/m³ or 40 J/cm³: the average heat generation density is $q_{hy}=e_{hy}/\tau_d$ For an annulus of thickness 2b (10 mm), assume that heat flows only axially (upward and downward) towards the nearest Cu—Ag spacers. Then the maximum temperature rise, ΔT mx, occurs at the midplane of each annulus, given by:

$$\Delta T_{mx} = \frac{q_{hy}}{2k} b^2 = \frac{e_{hy}}{2k_{an}\tau_d} b^2 \quad (12)$$

where $k_{an}$ is the thermal conductivity of YBCO. With ΔTmx=0.5 K, $k_{an}$=1.5 mW/cm K ("epoxy" at 20 K), b=0.5 cm, and $e_{hy}$=40 J/cm³, we obtain: $\tau_d$=6600 s; a discharge time of ~2 hours should be long enough to keep each annulus within 0.5 K of 27.1 K. Each Cu—Ag (k~10 W/cm K) spacer of ~1-mm thickness can easily conduct this heat to the liquid neon that surrounds the annulus magnet during the field-cooling process.

Because virtually the entire axial flux of the bore flows through the steel assembly of $D_{so}$ o.d. and $D_{si}$ i.d., conservation of flux results in:

$$\frac{\pi}{3}(a_2^2 + a_2 a_1 + a_1^2) B_o \simeq \frac{\pi}{4}(D_{so}^2 - D_{si}^2) \mu_o M_s \quad (13)$$

where $B_o$ is the central field. The left-hand side of Eq. 13 represents the total flux in the magnet bore ($\pi B_o a_1^2$) plus that in the annular space between $a_1$ and $a_2$, where $B(r)=B_o(a_2-r)/(a_2-a_1)$, decreasing linearly from $B_o a_1$ to 0 at $a_2$; $M_s$ is the magnetization of steel, low enough to make its effective $\mu \geq 100 \mu_o$. For a preferred embodiment, ($B_o$=4.7 T; 2$a_1$=55 mm; 2$a_2$=80 mm), with $\mu_o M_s$=1 T: $D_{si}$=229 mm and $D_{so}$=272 mm. A total of 150 these annuli, each 2-mm thick, for a mass of 40 kg, are used.

Steel annuli can be placed one at a time, manually. The steel assembly 88 can be to 300-mm long, nearly twice as long as the annulus magnet 62: unsupported, the midplane of the steel assembly is about 40 mm lower than that of the annulus magnet. The tie-rod assembly 64 attached to the bottom of the cryostat's upper section, supports the steel assembly. Conical spring washers maintain the clamping force constant despite difference in thermal contraction between system components.

In the r-direction, the coupling force between the two assemblies is unstable. The destabilizing radial force is zero when the two are symmetric in the φ and z-directions, but the force increases with radial displacement. If both bodies are symmetric in φ, a 1 mm offset sideways generates a lateral force of about 200 N. Because field homogeneity itself requires concentricity, it can be met by tight dimensioning and structural rigidity of the annulus magnet, the cryostat, and the steel assembly. This concentricity requirement is no different from that for a standard NMR magnet system, in which one such example is between the main magnet and its field shielding elements, a set of active coils or ferromagnetic tiles.

The coldhead 66 has two stages: the first stage 78 (30 K) for the radiation shields and the second stage 75 (15 K) for the magnet and Ne 84. In this embodiment, the coldhead remains with the cryostat even when it is shut off. To minimize heat input from the shutoff coldhead, each coldhead stage can be disengaged from its cooling target by a thermal switch 65 with actuator 68. Also, to minimize its vibration on measurement, the coldhead is mounted on the cryostat top plate through a vibration isolator 76. Of course, to provide a noise-free measurement environment, at least for up to two days, the coldhead may be shut off. A flexible thermal path 82 couples stage 75 to switch 65. A charcoal getter 77 is also used. Insulation 74, radiation shield 72 and a fill/vent port 70 for the coolant are also used.

The cryostat has a room-temperature bore of 38 mm. As shown in FIG. 7B, it has a space large enough to house the coldhead in its upper section. The tail section uses standard cryostat construction techniques to ensure concentricity of the tubes. The cryostat will house ~4 liters of solid Ne, so that it can take 48 hours for the entire solid Ne volume to warm up from 15 K to 24 K with a net average heat input of 0.3 W. The system can stay within this heat input limit, provided the radiation shields, disengaged from the 1$^{st}$ stage of the shut-off coldhead, remain below 60 K.

When the coldhead is disengaged, heat leaks raise the temperature of the shields from 30 K. The total radiation heat input to the shields of a total surface area of 6,600 cm² facing room temperature is 2 W over the temperature range 30-60 K. The conductive heat input to the shields through the support tubes (thin-walled stainless steel) over the same temperature is 1 W. The convective input is negligible, because the cryostat vacuum is kept below 10⁻⁵ torr with a charcoal getter placed in the cryostat vacuum space.

A heat input of 3 W increases the 20-kg copper shields' thermal energy by 520 kJ over a 48-h period, of which 50 kJ is absorbed by the shields. The large enthalpy density, 50 J/cm³, of solid nitrogen from 30 K to 60 K (63.1 K melting point), absorbs the rest (470 kJ): a 10-liter volume solid nitrogen (0.9 kg) is attached to the radiation shields.

The heat input (radiation and conductive) to the cold body consisting of the annulus magnet and a volume of solid neon is on average 0.3 W as the radiation shields warm up from 30 K to 60 K over a 48-h period. The required volume of solid neon to absorb a total enthalpy input of 52 kJ as it warms up from 15 K to 24 K is ~4 liters.

When neon freezes at 24.57 K, it contracts 15.9% by volume, or ~5% linear. From 24.57K down to 15 K, it contracts another 2.1% by volume, or ~0.7% linear. Similarly, nitrogen upon freezing at 63.1 K contracts 2% by volume, or ~0.7% linear, and between 63 K and 15 K, contracts another 17% by volume, or ~5% linear. Since there have been no adverse contraction (or expansion) effects, structurally or thermally, of solid $N_2$ systems built and operated in the range 10-77.3 K, there are no undesirable effects, structurally or thermally, in any solid Ne-cooled magnet systems. An RF coil probe 90 and sample can be inserted into the bore for spectral measurements. Gradient field coils can also be included in the probe or integrated into the magnet system. A spinner can also be included in the probe to rotate the sample container which can contain a gas or liquid. The coils and magnet system can be controlled by an operating system 100 such as a computer. The system 100 can include a data processor for data storage, processing of spectral data and display. The system 100 can be programmed to perform a pulse sequence excitation of the sample.

Figure 7C:
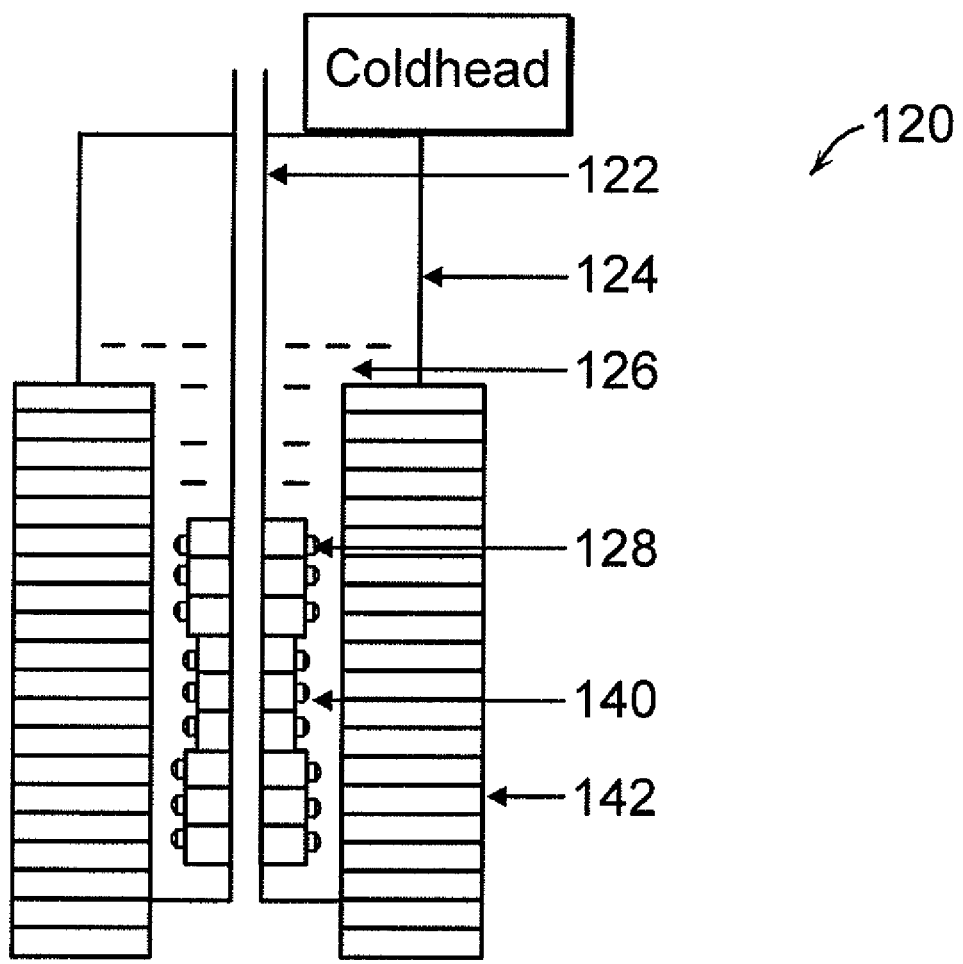
FIG. 7C illustrates an embodiment utilizing a coil assembly for magnetic field tuning.

FIG. 7C shows a detailed view of an annular magnet system 120 having a coil 128 with windings surrounding each annulus 140. The coil 128 provides for "tweaking" or magnetic field tuning of axial field variations. The coil is surrounded by shielding plates 142. The coolant 126 such as solid neon is housed in cryostat 124 which surrounds the room temperature bore 122. Shim coils can also be used with the system to make adjustments to the magnetic field distribution and can be placed in the annular cavity or bore about the sample to be measured. These can include x,y and xy corrections. Ferromagnetic tiles can also be placed in the annular cavity to reduce x,y and error harmonics.

Figure 8A:
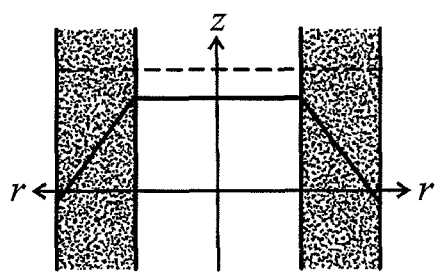
FIGS. 8A-8D illustrate a method of adjusting the magnetic filed intensity in an operating system in accordance with a preferred embodiment of the system.
Figure 8B:
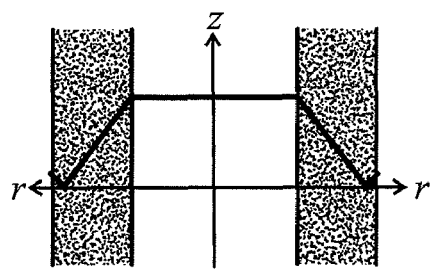
Figure 8C:
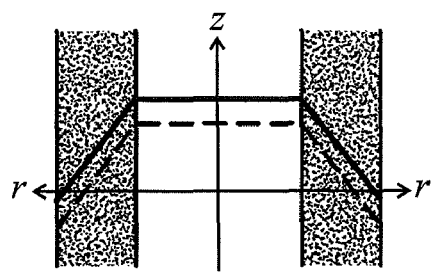
Figure 8D:
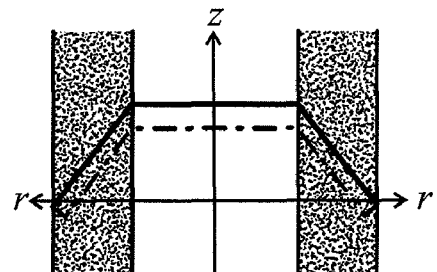

In the sequence illustrated in FIGS. 8A-8D a process for adjusting the field H(r) is illustrated. The shaded area is the cross-section of the annulus and the center is the annulus bore. In FIG. 8A, the dashed line shows the nonsuperconducting annuli in the external field of the energizing magnet and the solid line after field cooling. FIG. 8B shows the field after application of a positive field and a return to zero thereof. This indicates that a small positive adjustment in the field has no effect on the field in the bore. FIG. 8C shows a dashed line illustrating the application of a negative adjusting field and FIG. 8D shows the field after the adjusting field is returned to zero indicating a permanent adjustment in the field within the bore. Each annulus can have separate coils to provide a substantially separate adjustment for each annulus.

In another embodiment of this field-tuning process is a correct-and-set type method. FIG. 9A-9D shows four sets of $H_z(r)$ plots within an annulus of a "long" annulus assembly. Each plot is based on the critical-state model for a "Bean slab" of width 2a.

Figure 9A:
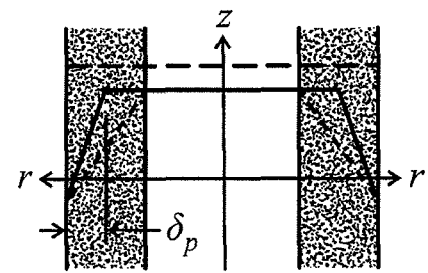
FIGS. 9A-9D illustrate another sequence for magnetic field tuning.

The shaded areas represent the cross section of an annulus ($2a_1$; $2a_2$), and the white center region the annulus bore of diameter $2a_1$—as stated above, it is an infinitely long and deep slab of width $2a_2$, with the central part of width $2a_1$ removed: each annulus is in the critical-state within a radial penetration depth of $\delta_p$, indicated in FIG. 9A, where the current density, $J_c$, is induced. In FIG. 9A the dotted lines correspond to the field profile when the entire annulus is in the critical state. As noted above, for the embodiment where the annulus magnet generates a central field of 4.7 T, it requires an average current density of 320 MA/m² uniformly distributed over the entire cross section of each annulus.

As in each $H_z(r)$ profile shown here, $dH_z(r)/dr=J_c$, in which $J_c$ is assumed field-independent here. In the actual case, because $J_c$ is field-dependent, the profile, and hence the bore field distribution, must be computed numerically.

The dashed horizontal line represents $H_z(r)$ of the normal-state annulus in the field of the energizing electromagnet. The solid lines represent $H_z(r)$ of the field-cooled annulus. (In reality there is virtually no difference in field amplitude between that represented by the dashed line and that by the solid horizontal line.) Realistically, the annulus is in the critical state only within the penetration depth of $\delta_p$. Because $J_c=10^9$ A/m², and $\delta_p=H_o/J_c$ (where $H_o=B_o/\mu_o$), $\delta_p \approx 3.7$ mm<<12.5 mm=($a_2-a_1$), for $B_o=4.7$ T—for clarity, $\delta_p$ is drawn greater than its actual value.

Figure 9B:
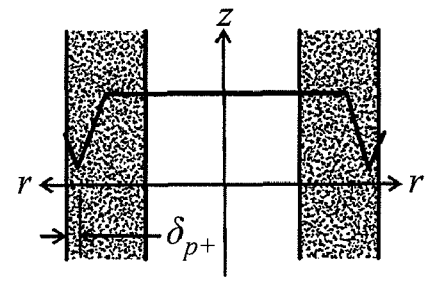

The profile in FIG. 9B corresponds to the annulus after it is subjected to a small positive tweaking field, $H_{tf}$. Its amplitude is drawn much greater than its actual size. Within a layer of $\delta_{p|}=H_{tf}/J_c$, a current is induced in the direction opposite to that already induced in the annulus, shielding the interior. Its contribution to the central field will be slightly reduced, because the net current flowing in the annulus that generates the central field is reduced by the presence of the current within this layer that flows in the opposite direction. When the tweaking field is reduced to zero, $H_z(r)$ returns to the original profile (the solid lines in FIG. 9A).

Figure 9C:
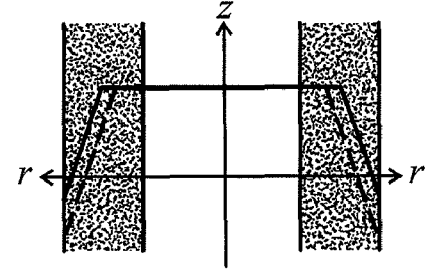

When a small negative tweaking field is applied as seen in FIG. 9C, the field, as indicated by the dashed lines, penetrates further into the annulus. Its contribution to the central field will be slightly enhanced because the net induced current in the annulus is increased.

Figure 9D:
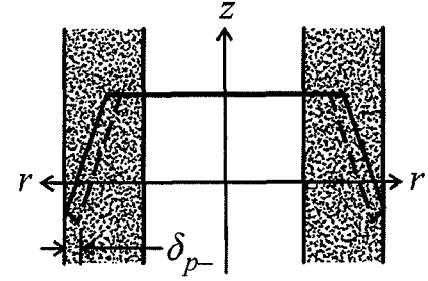

When the negative tweaking field is returned to zero, as in FIG. 9D the current is induced at the outermost layer of $\delta_{p-}$ in in the direction opposite to that of the original current. The original current layer ($\delta_p$) is thus shifted inward by and and a new current layer $\delta_{p-}$ is created: a net decrease in the central field.

The field-tweaking coil for the prototype (16 annuli) magnet consists of 16 copper-wound coils, each of which can be energized independently. The tweaking procedure can be iterative and make "gross" correction to the first few axial terms, i.e., z, $z^2$, and $z^3$. Further refinement must be dealt with by the combination of room-temperature shim coils and ferromagnetic shims placed in the annular space in the magnet bore. With $\delta_{p-}$ given by $\delta_{p-}=H_{tf}/J_c$, we compute $\delta_{p-}$ to be 0.08 μm for $\mu_o H_{tf}=10^{-4}$ T and $J_c=10^9$ A/m².

Before the application of a tweaking field, the current element in the annulus has an i.d. of $2(a_2-\delta_p)$, an o.d. of $a_2$, and a length 2b (not to be confused with an annulus thickness of 2b). When the current layer shifts inward by $\delta_{p-}<<a_1$, the corresponding dimensions become, respectively, $2(a_2-\delta_p-\delta_{p-})$, $2(a_2-\delta_{p-})$, and 2b (same length). When a current element's $a_1$, $a_2$ and 2b are changed to $a'_1=a_1-\delta$ and $a'_2=a_2-\delta$, the new current element parameters become: $\alpha'=(\alpha-\epsilon)/(1-\epsilon)$ and $\beta'=\beta/(1-\epsilon)$, where $\epsilon=\delta/a_1$. For $\epsilon<<1$, we may derive $\Delta B_o$, the change in the central field, from Eq. C1 with $B_z(0,0,0)=B_o$:

$$\Delta B_o = \left(\frac{\delta_{p-}}{a_1}\right) B_o \left[\frac{1}{\sqrt{1+\beta^2}} - \frac{1}{\sqrt{\alpha^2+\beta^2}}\right] \quad (14)$$

Note that, as expected from Eq. 8, when $a_1$ and $a_2$ are decreased, the central field increases. For the original current element dimensions of $a_1$=40 mm−3.7 mm=36.3 mm ($J_c=10^9$ A/m2), $a_2$=40 mm, and 2b=185 mm, with $\delta=\delta_{p-}=0.08$ μm, $B_o$=4.7 T, $\alpha$=1.102 and $\beta$=2.548, one obtains: $\Delta B_o \approx 5\times10^{-4}$ gauss, a negligible change.

To this increase in the central field, which, here at $5\times10^{-4}$ gauss, is really negligible, there is a subtracting flux density, $B_{o-}$, generated by the newly created thin current layer of $\delta_{p-}<<a_1$ flowing in the opposite direction at the rim, given approximately by:

$$B_{o-} \approx \mu_o J_c \delta_{p-} \quad (15)$$

which for this case is equal to 1 gauss. That is, the net decrease in the central field after application of $B_{ft}$=1 gauss in the negative direction is 1 gauss.

One field-tuning coil, a single turn of a 1-mmø copper wire wrapped around each annulus, generating 1 gauss, requires 3.2 A. At 15 K($p_{cu}$=2×10⁻⁸ Ωcm), Joule dissipation for this 1-gauss copper coil is 0.7 mW, a negligible level. (Nevertheless, the cryocooler will be kept running during field-tweaking). Because 16 pairs of 1-mmø copper conduct a lot of heat to the cold anchor (1st stage radiation shield), they will be disconnected from the anchor when the coldhead is disengaged for shipment or quiet measurement environment.

A field of no greater than $10^{-4}$ T (1 gauss) can be used to make the axial field NMR-quality. To evaluate this tuning-field coil, apply a tuning field to the annulus magnet, i.e., superconducting at 15 K but not yet field-cooled. In this state, the field distributions would be different from those shown in FIGS. 9A-9D, but each on-and-off tuning-field sequence of ~1 gauss will result in a trapped field of the same order of magnitude, which, in the absence of a background field of 4.7 T, are detectable with a Hall probe.

This measurement with the field-tuning coil can also quantify proximity effects on the neighboring annuli by the tuning field of the targeted annulus. Because the winding diameter of each 1-gauss field-tuning coil is 81 mm (except for those annuli in the center zone), it generates axial fields of 0.90, 0.68, 0.47, and 0.31 gauss, respectively, at the centers of successively more distant annuli. Clearly, each tuning field targeted at a particular annulus will likely affect quite significantly the magnetization of at least its two nearest annuli.

Figure 10:
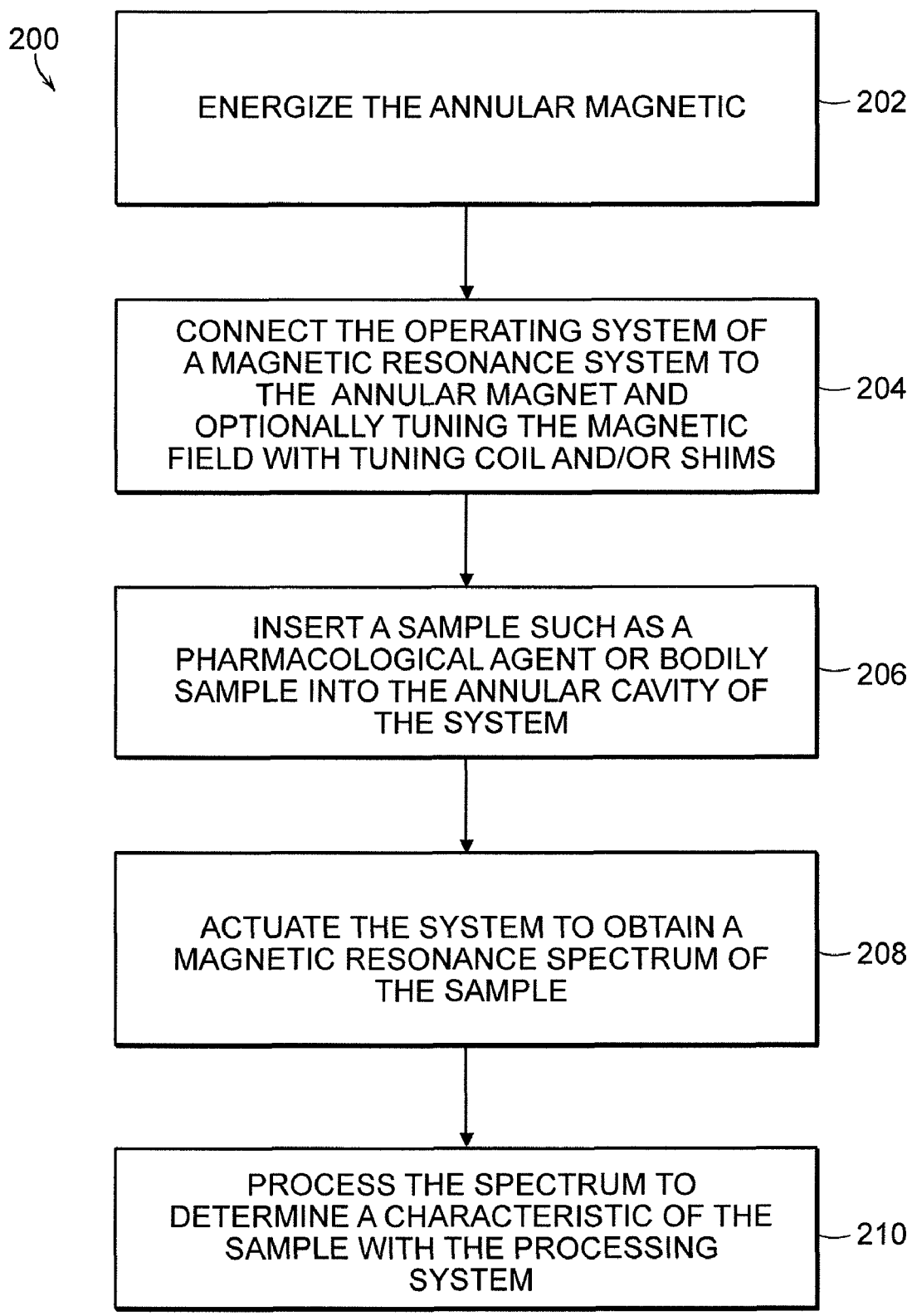
FIG. 10 illustrates a process sequence of using a preferred embodiment of the invention.

A method of using the magnetic resonance system in accordance with the invention is illustrated in the process sequence 200 of FIG. 10. After the annular magnet is energized 202 the magnet is optionally transported and connected 204 to the operating system of a magnetic resonance system. A sample is obtained such as a pharmacological agent or drug, or a bodily sample from a mammalian animal or patient. The sample is inserted 206 into the system and a spectrum is obtained 208. The system can then analyze the spectrum to determine a characteristic 210 such as a diagnosis of a condition of the patient or the suitability of a drug to treat a particular condition.

While the invention has been described in connection with specific methods and apparatus, those skilled in connection in the art will recognize other equivalents to the specific embodiments herein. It is to be understood that the description is by way of example and not as a limitation to the scope of the invention and these equivalents are intended to be encompassed by the claims set forth below.

What is claimed is:

1. A magnetic resonance system comprising:
  a a persistent mode magnet system having a plurality of superconducting annular layers, the annular layers comprising a rare-earth barium copper oxide compound having a tensile strength of at least 20 MPa and a current density of at least 10 MA/m² in a temperature range of 4k to 80k;
  a cooling system that cools the plurality of superconducting annular layers to an operating temperature such that the magnet system generates an operating magnetic field of at least 4.7T in a system cavity; and
  an energization system that energizes the persistent mode magnet system.

2. The system of claim 1 further comprising an operating system having a conductive magnetic field tuning coil.

3. The system of claim 2 wherein the conductive coil comprises a winding around each of the plurality of layers.

4. The system of claim 2 wherein the conductive coil adjusts a magnetic field generated by the persistent mode magnet system.

5. The system of claim 1 wherein system operates at a frequency of at least 300 MHz.

6. The system of claim 1 wherein the cavity has a diameter of 25 to 60 mm.

7. The system of claim 1 wherein the cooling system comprises a cryostat and a coolant.

8. The system of claim 7 wherein the coolant comprises a liquid or solid cryogen.

9. The system of claim 1 wherein the cooling system operates at a temperature in a range from 4 degrees Kelvin to 77 degrees Kelvin.

10. The system of claim 1 wherein each of the plurality of layers comprises a yttrium barium copper oxide (YBCO) material.

11. The system of claim 1 wherein the layers are cooled using a coolant selected from the group comprising helium, neon and nitrogen.

12. The system of claim 1 wherein the superconducting elements comprise a bulk superconducting material.

13. The system of claim 1 wherein the magnet system has a homogeneous field distribution that varies less than 0.1 ppm for a 10 mm diameter spherical volume.

14. The system of claim 1 further comprising a spacer positioned between a pair of the layers.

15. The system of claim 14 wherein the spacer comprises a copper-silver alloy.

16. The system of claim 14 wherein the spacer has a tensile strength of at least 500 MPa.

17. The system of claim 1 further comprising a radio frequency (RF) device that emits a radio frequency signal within the cavity of the magnet system.

18. The system of claim 1 wherein the superconducting layers have a tensile strength of at least 40 MPa.

19. The system of claim 1 wherein the shim element further comprises a shim coil to adjust a magnetic field distribution within the cavity at room temperature.

20. The system of claim 1 wherein the superconducting layers have a current density of at least 100 MA/m² at 77.3 degrees K.

21. The system of claim 1 wherein the annular magnet has a field intensity of at least 5 T within a cavity.

22. The system of claim 1 wherein a shim element is positioned between the superconducting annular layers.

23. The system of claim 22 wherein the shim element comprises a coil in the cavity.

24. The system of claim 22 wherein the shim element comprises a ferromagnetic tile.

25. The system of claim 1 wherein the compound is selected from the group comprising DyBCO, NdBCO, HoBCO and YBCO.

26. The system of claim 1 further comprising a processor to control operation of the system.

27. The system of claim 26 wherein the processor is programmed to apply a stored pulse sequence and record magnetic resonance spectral data.

28. The system of claim 1 wherein each of the plurality of layers comprises a plurality of thin film layers of semiconductor material having a thickness of less than 1 mm.

29. A method of using a persistent mode magnet system for magnetic resonance spectroscopy comprising:
  energizing superconducting magnet layers to form a persistent mode magnetic field, the magnet layers comprising stacked annuli that surround a cavity for insertion of a material, the annuli including a rare-earth barium copper oxide compound having a tensile strength of at least 20 Mpa and a current density of at least 10 Ma/m² in a temperature range of 4k to 80k;

subsequently inserting the magnet annuli into a magnetic resonance operating system generating a magnetic filed of at least 4.7 T; and obtaining a magnetic resonance spectrum of the material with the operating system.

30. The method of claim 29 further comprising transporting the magnet from an energizing system to the operating system.

31. The method of claim 30 further comprising cooling the magnet with a cooling system.

32. The method of claim 31 further comprising cooling with a coolant selected from the group including liquid helium (e.g. $T_{op}$=4.2K), solid neon (e.g. $T_{op}$=<24 K), liquid neon (e.g. $T_{op}$=27 K), solid nitrogen (e.g. $T_{op}$=<40 K), liquid nitrogen (e.g. $T_{op}$=77 K).

33. The method of claim 29 further comprising cooling the magnet during transport.

34. The method of claim 33 further comprising transporting the annular magnet with a solid cryogen such as neon, nitrogen or liquid helium.

35. The method of claim 29 further comprising providing an operating system including a conductive coil to adjust the magnetic field.

36. The method of claim 29 further comprising using a shield during transport of the magnet.

37. The method of claim 29 further comprising operating the superconducting layers having a current density of at least 100 MA/m² at 77.3 degrees Kelvin or lower.

38. The method of claim 29 further comprising operating the magnetic resonance system at a temperature in a range of 4 K to 80 K.

39. The method of claim 29 wherein the step of energizing the magnet further comprises:

positioning an annular magnet in an energizing electromagnet;

energizing the electromagnet to field cool the annular magnet;

cooling the annular magnet with a cooling system to a selected temperature and discharging the electromagnet to trap a magnetic field; and inserting the annular magnet with the trapped field into the magnetic resonance system.

40. The method of claim 29 further comprising programming a computer to control operation of the operating system.

41. The method of claim 29 further comprising using an annular magnet including YBCO annuli.

42. The method of claim 29 further comprising removing a bodily sample from a mammalian animal and using the magnetic resonance to obtain spectral data for the sample.

43. The method of claim 29 further comprising inserting a pharmacological agent into the magnetic resonance system and obtaining a magnetic resonance spectrum of the agent.

44. The method of claim 29 further comprising generating a magnetic field of at least 7 Tesla with the annular magnet.

45. The method of claim 29 further comprising a magnetic field tuning device that comprises a shim coil.

46. The method of claim 45 further comprising a spacer that has a tensile strength of at least 500 MPa.

* * * * *